(12) United States Patent
Shin et al.

(10) Patent No.: US 7,274,471 B2
(45) Date of Patent: Sep. 25, 2007

(54) SYSTEMS AND METHODS FOR MEASURING DISTANCE OF SEMICONDUCTOR PATTERNS

(75) Inventors: Koung-Su Shin, Kyungki-do (KR); Kwang-Jun Yoon, Kyungki-do (KR); Sun-Yong Choi, Kyungki-do (JP); Chung-Sam Jun, Kyungki-do (KR); Dong-Jin Park, Kyungki-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 326 days.

(21) Appl. No.: 11/012,005

(22) Filed: Dec. 13, 2004

(65) Prior Publication Data

US 2005/0134867 A1    Jun. 23, 2005

(30) Foreign Application Priority Data

Dec. 18, 2003    (KR) .................. 10-2003-0093399

(51) Int. Cl.
    *G01B 11/14*    (2006.01)
(52) U.S. Cl. .................. 356/625; 356/237.5; 382/145
(58) Field of Classification Search ................ 356/614, 356/625, 635, 237.5; 382/145, 149, 155; 348/87, 126

See application file for complete search history.

(56) References Cited

U.S. PATENT DOCUMENTS 6,481,003 B1 * 11/2002 Maeda ...................... 430/22

* cited by examiner

*Primary Examiner*—Richard A. Rosenberger
(74) *Attorney, Agent, or Firm*—Marger Johnson & McCollom, P.C.

(57) ABSTRACT

A system and method of measuring a distance of semiconductor patterns is provided. The system includes a microscope and a control unit. The control unit calculates standard coordinates of standard points in view-fields that include spots, spot coordinates of spots with respect to standard points, real coordinates of spots from both of the standard coordinates and spot coordinates, and finally the distance between the two spots from the first and second real coordinates. Coordinates are determined using high magnification, in conjunction with pixel counting, allowing more precise distance measurements.

23 Claims, 7 Drawing Sheets

Fig. 1

(PRIOR ART)

SYSTEMS AND METHODS FOR MEASURING DISTANCE OF SEMICONDUCTOR PATTERNS

CROSS-REFERENCE TO RELATED APPLICATIONS

This U.S. non-provisional patent application claims priority under 35 U.S.C. § 119 of Korean Patent Application P2003-93399 filed on Dec. 18, 2003, the entire contents of which are hereby incorporated by reference.

BACKGROUND OF THE INVENTION

The present invention relates to inspection systems of a semiconductor product and methods thereof, and especially to systems and methods for measuring distances between semiconductor patterns.

Conventionally, a semiconductor wafer (hereinafter, referred to as 'wafer') includes a plurality of integrated circuit devices that are repeatedly disposed. The integrated circuit devices are fabricated by applying a plurality of semiconductor fabrication processes to a wafer. After performing a predetermined semiconductor fabrication processes, various kinds of inspection steps may be applied to determine whether the performed semiconductor fabrication processes are carried out properly. According to the kinds of the performed semiconductor fabrication processes, the inspection may be performed in the various kinds of methods. For example, a step for measuring a thickness of a material layer may be carried out after depositing the material layer. A step for measuring widths, lengths or distances of patterns may be performed after a photolithographic process or an etch process to form patterns.

Recently, as a high integration of semiconductor devices is rapidly progressing, a distance (i.e., a width, a length, or a space) between micro patterns becomes important. Therefore, micro patterns of tens of nanometers to several micrometers should be carefully measured and managed, even though carelessness is often associated with measurements and management of macro patterns of several micrometers to hundreds micrometers.

Conventionally, the distance between the macro patterns is measured by equipment such as an optical microscope. A method for measuring a distance between macro patterns using conventional methods will be explained referring to FIG. 1.

Figure 1:
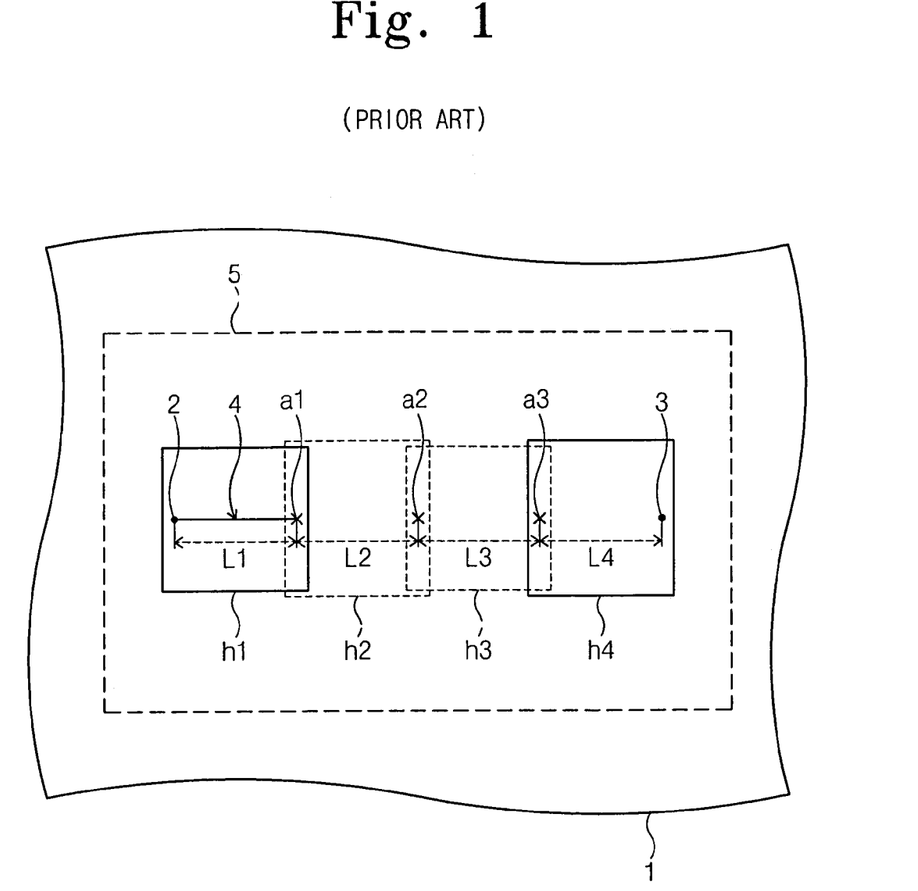
FIG. 1 is a schematic view illustrating a conventional method of measuring a distance between two points on a wafer.

FIG. 1 is a schematic view illustrating a conventional method for measuring a distance between two spots on a wafer.

Referring to FIG. 1, an optical microscope has a predetermined field of view (hereinafter referred to as 'view-field'). A picture of the view-field is changed according to a magnification of the optical microscope. For example, an area of the wafer 1 shown in a low-magnification view-field 5 is larger than that shown in high-magnification view-fields h1, h2, h3 and h4. Conversely, the high-magnification view-field h1, h2, h3 and h4 display more detailed pictures compared to the low-magnification view-field 5.

The conventional equipment having the optical microscope includes a scaled ruler 4 displayed in the view-field.

A method for measuring a distance between the macro patterns using the conventional equipment having the optical microscope will be explained hereinafter. First, a magnification of the optical microscope is lowered to secure a low-magnification view-field 5 showing both of first and second spots 2 and 3 to be measured. Then an operator sets the ruler 4 in the low-magnification view-field 5 to the spots 2 and 3 and reads the scale of the ruler 4, so that the distance between the spots 2 and 3 is measured.

In the above method, the low-magnification view-field 5 may have a real distance error of the measured macro pattern because of the low accuracy of the low-magnification view-field 5. As the magnification of the optical microscope becomes lowered from high to low, a real distance defined by the unit scale of the ruler 4 may be increased. Therefore, even if a small error occurs in the process for setting the scales of the ruler 4 to the spots 2 and 3 depending on the operator's eye view, it may become a large error in the distance between the macro patterns.

To measure a macro pattern distance using high magnification, at least one stepping point between the first and second spots 2 and 3 is selected. In this case, the selection of the stepping point depends on the eye of the operator. FIG. 1 illustrates the first, second and third stepping points a1, a2 and a3. A first high magnification view-field h1 is secured by increasing a magnification of the optical microscope. The first high magnification view-field h1 displays the first spot 2 and the first stepping point a1 at the same time. A first distance L1 between the first spot 2 and the first stepping point a1 is determined using the scales of the ruler 4 in the first high magnification view-field h1 by the operator, etc. The first high magnification view-field h1 is then moved to a second high magnification view-field h2 displaying the first and second stepping points a1 and a2. A second distance L2 between the first and second stepping points a1 and a2 is measured using the ruler 4 in the second high magnification view-field h2. Then, as illustrated in FIG. 1, the second high magnification view-field h2 is moved to third and fourth magnification view-fields h3 and h4 serially. Simultaneously, a third distance L3 between the second and third stepping spots a2 and a3, and a fourth distance L4 between the third stepping spot a3 and a second spot 3 are measured serially. The first, second, third, and fourth distances L1, L2, L3, and L4 are summed to calculate the distance between the first and second spots 2 and 3.

The above method for measuring a distance using the high magnification view-fields h1, h2, h3, and h4 may decrease a measuring error compared to that using the low magnification view-field 5. However, various errors can occur in the method using high magnification view-fields h1, h2, h3, and h4. That is, the selection of the stepping points a1, a2 and a3 depends on the eye of the operator, so that the error with respect to the position of the stepping points a1, a2, and a3 can occur according to the movement of the view-fields. In addition, the distance between the first spot 2 and the second spot 3 is measured several times partially. Thus, errors in measurement may occur repeatedly and accrue towards a larger total error. That is, small errors in measurement may occur repeatedly compared to the method using the low magnification view-field 5. As a result, the error of the measured distance of the macro patterns may be degraded in the method using the high magnification. In addition, the method using the high magnification may be complicated due to the process of selecting the stepping points a1, a2, and a3, with the increasing partial measurements for measuring the total distance.

SUMMARY OF THE INVENTION

The present invention is directed to systems and methods of measuring distance of semiconductor patterns, which are capable of reducing errors in measurement.

The present invention is also directed to systems and methods of measuring the distance simply.

In one embodiment of the present invention, a distance measuring system for measuring a distance between two spots on a wafer may include a microscope for producing a picture of a predetermined view-field displaying a predetermined region of the wafer, and a control unit. The control unit calculates standard coordinates of standard points in the view-fields that include the spots with respect to a basis point of the wafer, spot coordinates of the spots with respect to the standard points, real coordinates of the spots from both of the standard coordinates and the spot coordinates, and a distance between the two spots from the real coordinates.

Specifically, the standard points may be center points of the view-fields. The spot coordinates may be calculated using pixels of the picture in the view-fields picked up by the microscope Specifically, the microscope may be an optical microscope. The optical microscope may include a stage where a wafer is loaded, a scan unit for capturing a picture in the view-field, an image sensor for taking the picture captured by the scan unit, and a position sensor connected to at least one of the stage and the scan unit to sense a position of the view-field with respect to the wafer. In this case, at least one of the stage and the scan unit are capable of moving horizontally The distance measuring system may further include a display device for displaying at least a view-window indicating the picture of the view-field. The view-window may further display an indicator. The indicator may include a variable line capable of being extended according to a movement of the view-field. The display device may further display a map illustrating an entire region of the wafer on a specific scale. Conversely, the distance measuring system may further include a second display device for displaying the map. If the map is displayed, the coordinates control unit may calculate coordinates of the corresponding points with respect to a basis point of the map, and the standard coordinates from the coordinates of the corresponding points.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention. In the drawings.

DETAILED DESCRIPTION OF PREFERRED EMBODIMENTS

Preferred embodiments of the invention will be described below in more detail with reference to the accompanying drawings. The invention may, however, be embodied in different forms and should not be constructed as limited to the embodiments set forth herein. Rather, these embodiments are provided so that this disclosure will be thorough and complete, and will fully convey the scope of the invention to those skilled in the art. Like numerals refer to like elements throughout the specification.

Hereinafter, some embodiments of the invention will be described in conjunction with the accompanying drawings.

Figure 2:
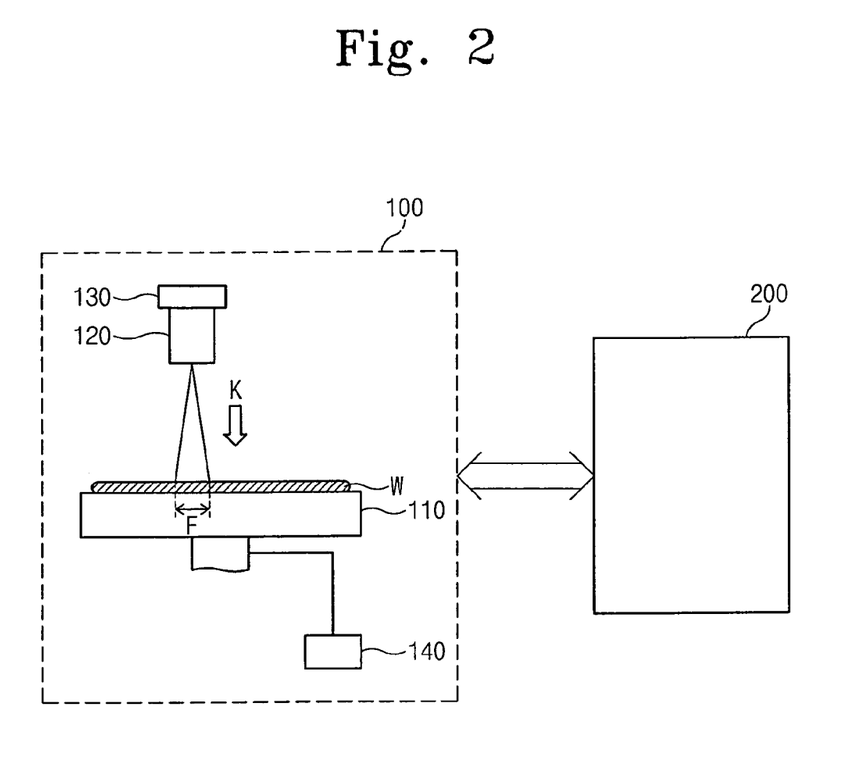
FIG. 2 is a view of a system for measuring a distance between semiconductor patterns according to an embodiment of the invention.

FIG. 2 illustrates a system for measuring a distance between semiconductor patterns according to an embodiment of the invention.

Referring to FIG. 2, the distance measuring system according to the invention includes a microscope 100 and an operator interface 200. The microscope 100 includes a view-field F. The view-field F is a region where the microscope 100 can display and be varied according to a magnification of the microscope 100.

The microscope 100 comprises a stage 110 where a wafer W is loaded, a scan unit 120 for capturing a picture of the view-field F and an image sensor 130 for taking the picture captured by the scan unit 120. The microscope 100 may be an optical microscope using light of a predetermined wavelength.

The scan unit 120 and the stage 110 may move horizontally with respect to one another. Therefore, the view-field F may be moved to display an entire region of the wafer W.

The scan unit 120 may include an eye lens unit and an object lens unit capable of changing a magnification. The image sensor 130 is connected to one side of the scan unit 120. For example, the image sensor 130 may be mounted, being fixed to the eye lens unit. If the scan unit 120 may be moved horizontally, the image sensor 130 may be moved together with the scan unit 120.

The image sensor 130 may take a picture of the view-field F using a plurality of pixels. The image sensor 130 may be a charge coupled device (CCD) camera.

The real distance defined by a width of a unit pixel of the picture taken by the image sensor 130 is varied according to a magnification of the microscope 100. That is, in case of a high magnification, the real distance defined by the width of the unit pixel is smaller than that of a low magnification. The real distance refers to a real distance on the wafer W. Assume that, for example, when the magnification is ×100, the real distance defined by the width of the unit pixel is 0.1 µm. When the magnification is ×10, the real distance defined by the width of the unit pixel may be 1.0 µm.

In other words, the real area of the view-field F is changed according to the magnification of the microscope 100. The real area of the view-field F is smaller when the microscope has a high magnification than when it has a low magnification. The real area refers to a real area of the wafer W.

The microscope 100 may include a position sensor 140. The position sensor 140 senses the position of the scan unit 120 or the stage 110 to sense a position of the view-field F with respect to the wafer W. FIG. 2 relates to an one embodiment in which only the stage 110 is moved horizontally, and illustrates a state where the position sensor 140 is connected to the stage 110. As not illustrated, if the scan unit 120 is capable of being moved horizontally, the position sensor 140 is also connected to the scan unit 120 to detect the position of the view-field F with respect to the wafer W.

The operator interface 200 manages the microscope 100. The operator interface 200 may exchange predetermined signals (e.g., a command signal or a data signal) with the microscope 100 by a network (e.g., RS-232C) or a bus.

Figure 3:
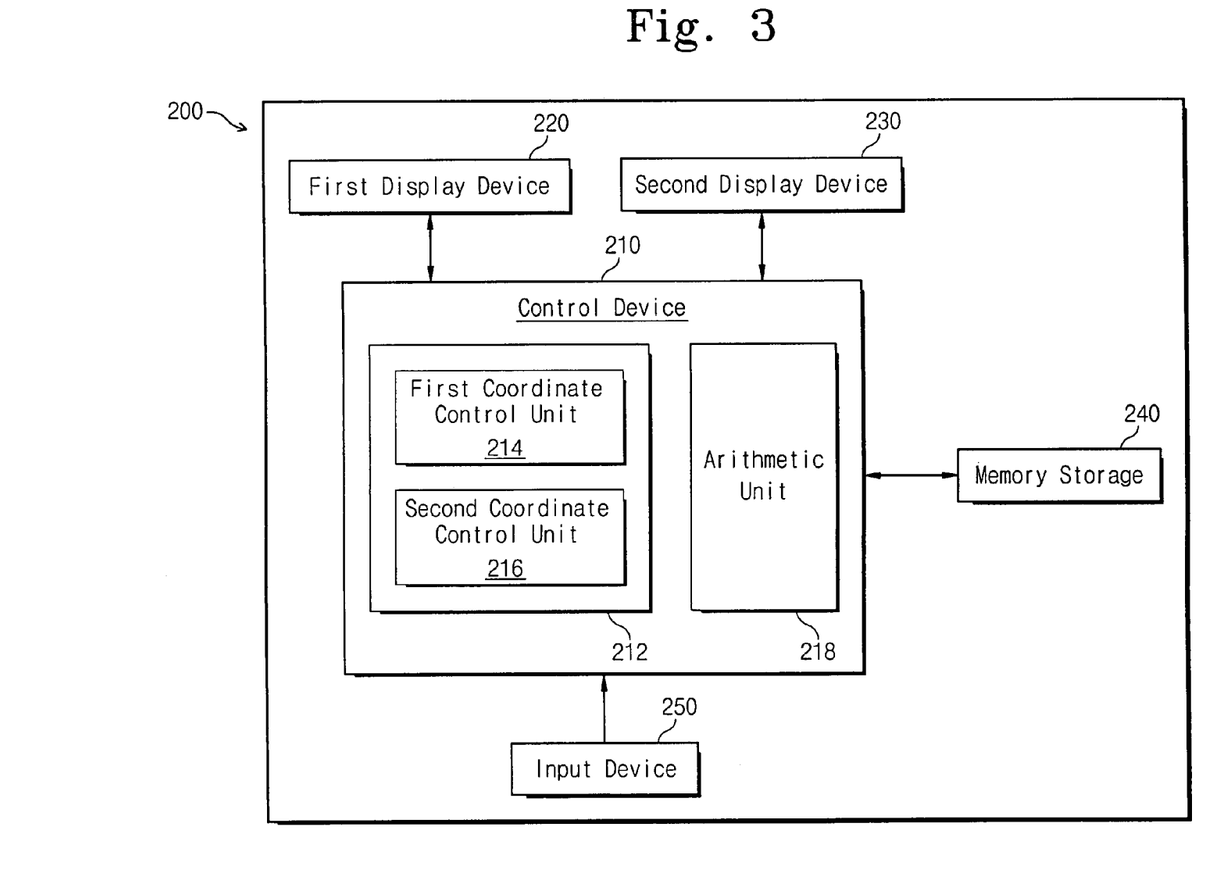
FIG. 3 is a block diagram of the operator interface in FIG. 2.
Figure 4:
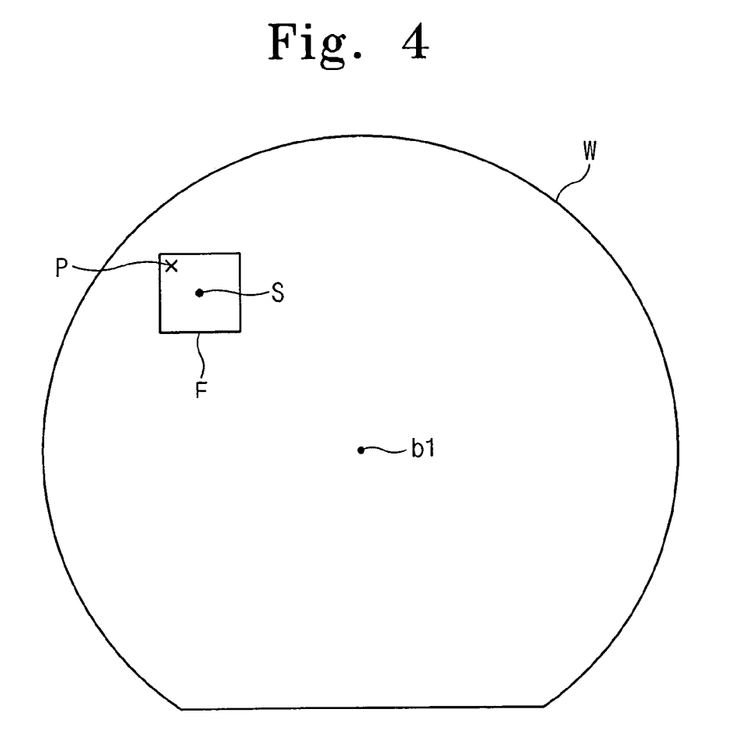
FIG. 4 is a top plan view seen in the direction of K in FIG. 2.
Figure 5:
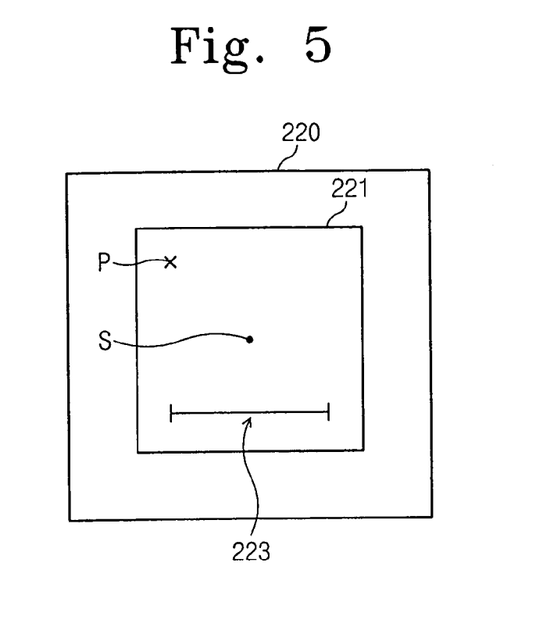
FIGS. 5 and 6 illustrate the first and second display devices in FIG. 2, respectively.
Figure 6:
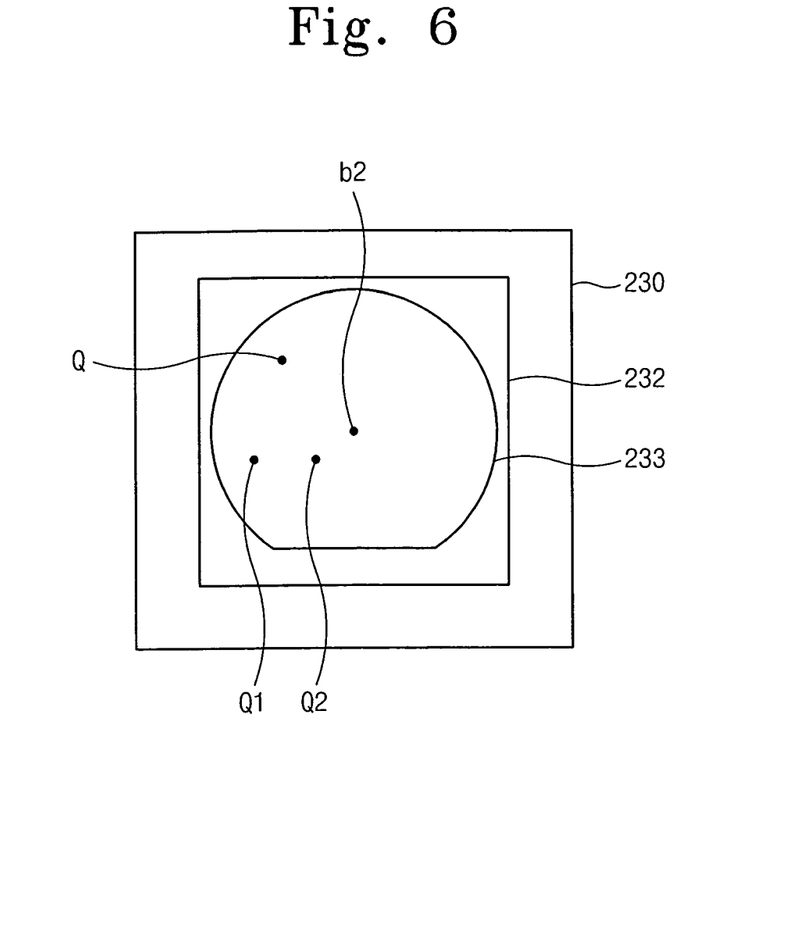
Figure 7:
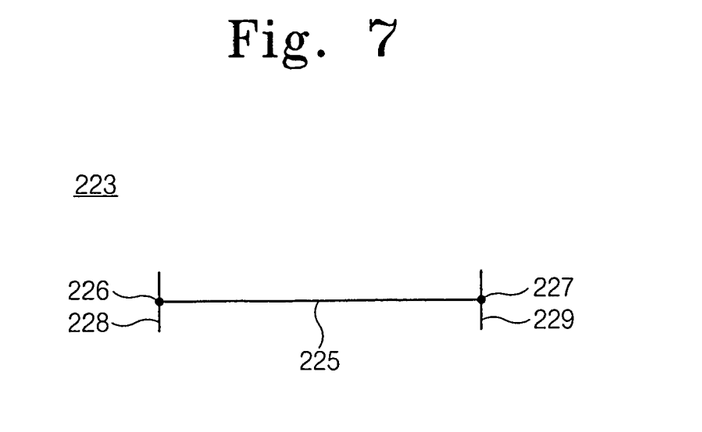
FIG. 7 is a drawing of the indicator in FIG. 4.

FIG. 3 is a block diagram showing the operator interface in FIG. 2, FIG. 4 is a top plan view shown in the direction of K in FIG. 2, FIGS. 5 and 6 illustrate the first and second display devices in FIG. 2, and FIG. 7 illustrates the indicator in FIG. 4.

Referring to FIGS. 2 through 7, the operator interface 200 includes a control device 210, at least one of display devices 220 and 230, a memory storage 240 and an input device 250.

The memory storage device 240 stores predetermined data or predetermined programs. For example, the memory storage 240 may be a hard disc or an EEPROM device. The input device 250 inputs a predetermined external signal into the operator interface 200 and may include a keyboard or a mouse, for example.

One of the first and second display devices 220 and 230 displays a view-window 221 and the other may display a map-window 232, as in FIGS. 5 and 6, respectively. Conversely, the second display device 232 may be omitted to make the first display device 220 display both the view-window 221 and the map-window 232. The view-window 221 displays the pictures of the view-field F taken by the image sensor 130. The picture data taken by the image sensor 130 is transferred to the operator interface 200 by the network or the bus, and the control device 210 displays the picture data in the view-window 221. The picture data may be transferred via an inner memory unit (not shown) in the control device 210 or the memory storage 240.

An indicator 223 may be further displayed in the view-window 221. The indicator 223 includes a variable line 225, first and second fixed points 226 and 227, and first and second bars 228 and 229, shown in FIG. 7. The variable line 225 may be extended along a movement of the view-field F displayed in the view-window 221. Both end points of the variable line 225 are first and second fixed points 226 and 227. The first and second bars 228 and 229 pass the first and second fixed points 226 and 227, respectively. The first and second bars 228 and 229 may be perpendicular to the variable line 225. The first and second fixed points 226 and 227 may be fixed to a spot P to be measured in the view-field F displayed in the view-window 221, as shown in FIG. 5, by an external command inputted into the input device 250 and a program etc. stored in the memory storage 240. The indicator 223 makes it easy to select and determine the patterns to be measured in the wafer W.

The map-window 232 displays a map 233 indicating an entire region of the wafer W on a predetermined scale. After the wafer W is loaded on the stage 110, the control device 210 displays the map-window 232 from the information of the wafer stored in the memory storage 240 and the information related to the wafer W and the stage 110 stored in the memory storage 240. The information of the wafer W includes a size of the wafer W, information regarding semiconductor products formed on the wafer W (e.g., size and kinds of the semiconductor products), etc. The information related to the wafer W and the stage 110 include a position of the wafer W with respect to the stage 110.

The control device 210 includes a coordinates control unit 212 and an arithmetic unit 218.

A standard point S is placed in the view-field F, as shown in FIG. 5. The standard point S is a standard for detecting the position of the view-field F with respect to the wafer W. The standard point S may be a center point of the view-field F. The standard point S may be set to a different point in the view-field F according to circumstances.

Referring to FIG. 4, the coordinates control unit 212 calculates standard coordinates of the standard point S with respect to a basis point b1 of the wafer W, and spot coordinates of the spot P with respect to the standard point S. That is, the standard coordinates corresponds to absolute coordinates of a wafer coordinate system having the basis point b1 as an origin, and the spot coordinates corresponds to relative coordinates having the standard point S as an origin in the wafer coordinate system. The basis point b1 may be a center point of the wafer W as illustrated in FIG. 4. The basis point b1 may also be another point on the wafer W.

The standard coordinates may be calculated from a signal transferred from a position sensor 140. The spot coordinates may be calculated using the pixels in the picture displayed in the view-window 221. That is, the spot coordinates may be calculated from the number of pixels between the standard points S and the spot P. Therefore, the spot coordinates may be calculated more precisely as the magnification of the microscope 100 increases.

Meanwhile, the coordinates control unit 212 may calculate the standard coordinates in another way. Specifically, referring to FIG. 6, the coordinates control unit 212 calculates coordinates of a corresponding point Q in the map 233 that corresponds to the standard point S, and calculates the standard coordinates from the coordinates of the corresponding point Q. The coordinates of the corresponding point Q are coordinates of a map coordinate system having the basis point b2 of the map 233 as an origin. In other words, the coordinate control unit 212 calculates the coordinates of the corresponding point Q, and the standard coordinates by applying a predetermined ratio to the coordinates of the corresponding point Q.

The predetermined ratio is that of the wafer W to the map 233. The basis point b2 of the map 233 may be a center point of the map 233. Of course, the basis point b2 of the map may be another point on the map 233.

The coordinates control unit 212 may include a first coordinate control unit 214 for calculating the standard coordinates and a second coordinate control unit 216 for calculating the spot coordinates. In this case, the first coordinate control unit 214 may calculate the standard coordinates using position signal, etc. transferred by the microscope 100. In contrast, the first coordinate control unit 214 calculates the coordinates of the corresponding point Q, and the standard coordinates from the coordinates of the corresponding point Q. The second coordinate control unit 216 may calculate the spot coordinates using the pixels of the picture displayed in the view-window 221.

The control device 210 may store the coordinates (i.e., standard coordinates, spot coordinates, or coordinates of the corresponding points) calculated by the coordinates control unit 212 in the inner memory unit (not shown) or the memory storage 240.

The arithmetic unit 218 calculates real coordinates of the spot P from the standard coordinates and the spot coordinates. The real coordinates correspond to the absolute coordinates of the spot P with respect to the coordinate system of the wafer W. The real coordinates may be stored in the memory storage 240. In addition, the arithmetic unit 218 calculates a distance between two spots P1 and P2, each corresponding to two real coordinates from two standard coordinates and two spot coordinates.

The memory storage 240 stores a program for controlling a series of operations of the fully explained control device 210.

A method of measuring distance of the macro patterns on the wafer will be explained hereinafter. The method uses a distance measuring system having the above structure.

Figure 8:
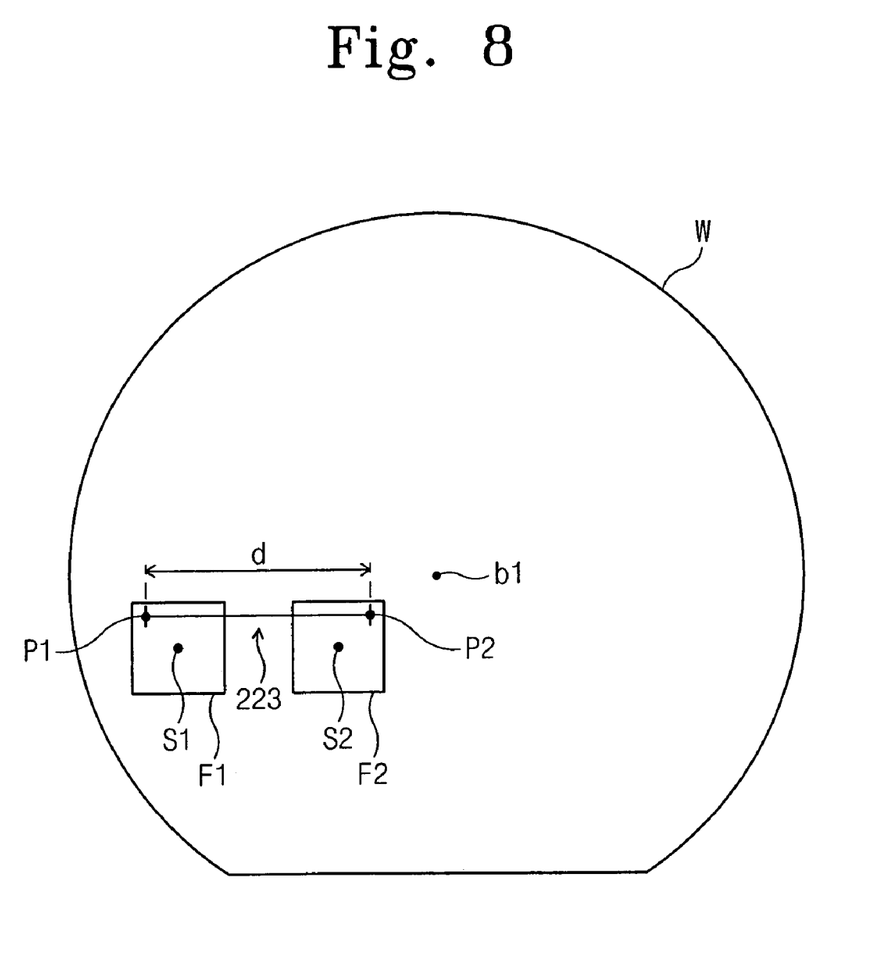
FIG. 8 is a top plan view illustrating a method of measuring a distance of semiconductor pattern according to another the invention, seen in the direction of K in FIG. 2.
Figure 9:
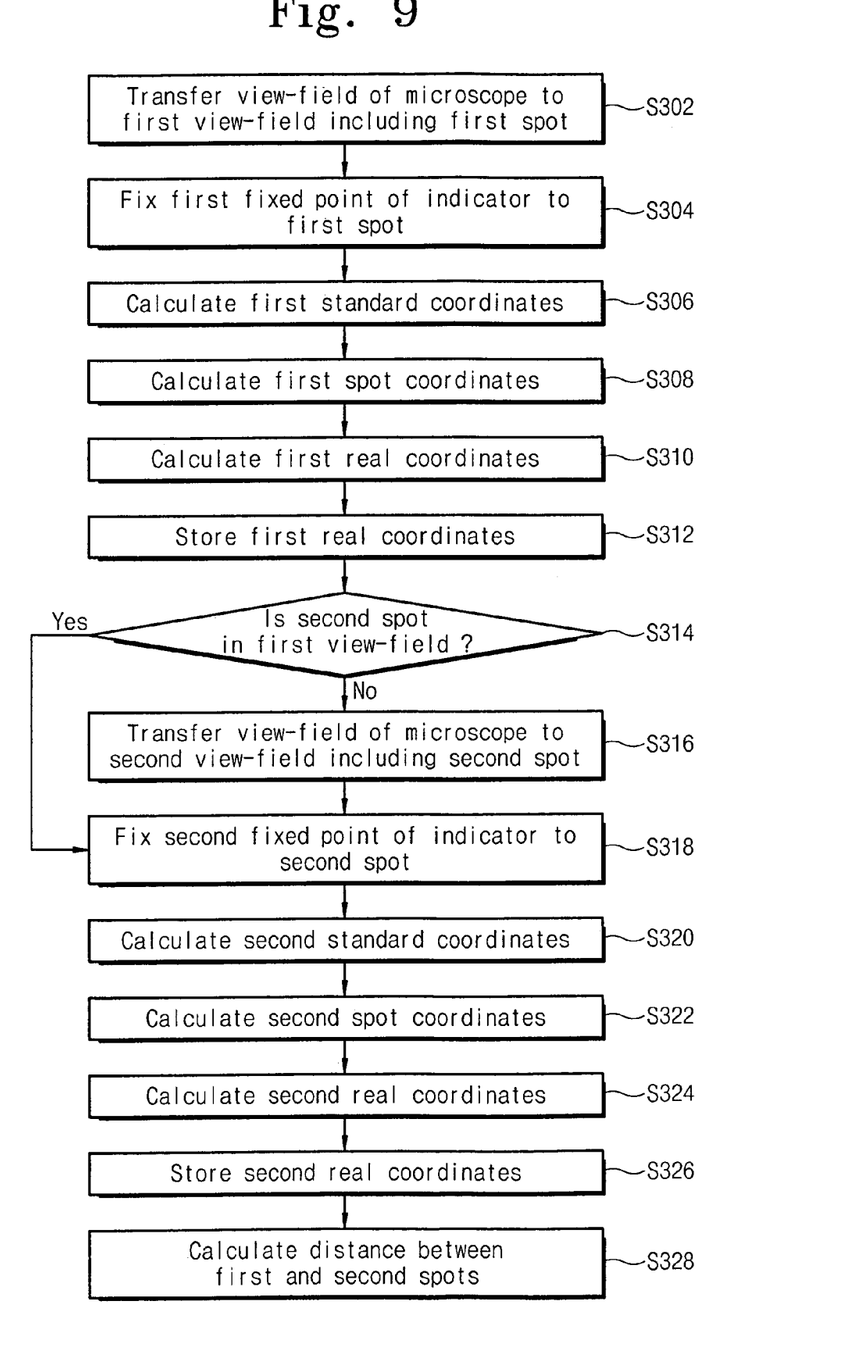
FIG. 9 is a flow chart illustrating a method of measuring a distance between the semiconductor patterns according to still another embodiment of the invention.

FIG. 8 is a top plan view seen in the direction of K in FIG. 2 illustrating a method of measuring a distance between semiconductor patterns according to some embodiments of the invention. FIG. 9 is a flow chart illustrating the method of measuring the distance between the semiconductor patterns according to an exemplary embodiment of the invention. The flow chart includes a program processed by the distance measuring system, and the program is stored in a memory storage.

Referring to FIGS. 2, 3 and 5 through 9, a wafer W is loaded on a stage 110. The first spot P1 and the second spot P2 illustrated in FIG. 8 are both end points of the distance to be measured. The distance 'd' between the first and second spots P1 and P2 may be a width, a length or an interval between patterns. When the wafer W is loaded, the control device 210 displays the picture of the view-field F taken by the microscope 100 in the view-window 221. In addition, the control device 210 may display a map on the map-window 232 using information regarding the wafer W and information related to the wafer W and the stage 110 that are stored in the memory storage 240.

The control device 210 transfers the view-field F of the microscope 100 to a first view-field F1 including the first spot P1 (step S302). The first view-field F1 may have a high magnification. The magnification of the first view-field F1 corresponds to high magnification of the microscope 100. For example, the first view-field F1 may have a magnification of ×100 to ×200. The view-field F of the microscope 100 may have a magnification lower than that of the first view-field F1 while being transferred to the first view-field F1. Therefore, the view-field F of the microscope 100 may be moved to the first view-field F1 faster. Conversely, the view-field F of the microscope may be simply transferred with the same magnification as that of the first view-field F1.

An indicator 223 is generated in the view-window 221 displaying the first view-field F1, and a first fixed point 226 of the indicator 223 is fixed to the first spot P1 (step S304). The coordinates control unit 212 may calculate first standard coordinates of a first standard point S1 in the first view-field F1 (step S306). The first standard coordinate is an absolute coordinate of the first standard point S1 with respect to a wafer coordinate system having a basis point b1 of the wafer W as an origin. The coordinates control unit 212 may calculate the first standard coordinates directly by a position sensor 140. Conversely, the coordinates control unit 212 calculates the coordinates of a first corresponding point Q1 of the map 233 corresponding to the first standard point S1, and then may perform an operation for applying a predetermined ratio to the coordinates of the first corresponding point Q1, to calculate the first standard coordinates. The calculated standard coordinates may be stored in a memory storage 240. The step S306 for calculating the standard coordinates may be performed upon receiving a signal from performing the step S304 for fixing the first fixed point 226. Conversely, the step S306 for calculating the standard coordinates may be carried out after the view-window 221 is transferred to the first view-field F1 (step S302). That is, the step S304 for fixing the first fixed point 226 may be performed after the step S306 for calculating the first standard coordinates.

Continuing on, the coordinates control unit 212 may calculate the spot coordinates of the first spot P1 (step S308). The first spot coordinates are coordinates of a relative coordinate system having the first standard point S1 as an origin in the wafer coordinate system. The first spot coordinates may be calculated using the pixels in the view-window 221. For example, the first spot coordinates are calculated using the number of pixels between the first standard point S1 and the first spot P1, and a width of the pixels (a width parallel to a side or a width of diagonal). The first view-field F1 displayed in the view-window 221 has a high magnification and the real distance defined by the unit pixel of the view-window 221 is very small. Therefore, the error in measurement can be reduced. The first spot coordinates may be stored in the memory storage 240. The step for calculating the first spot coordinates (step S308) may be performed upon receiving a signal from performing the step S304 for fixing the first fixed point 226.

The arithmetic unit 218 calculates the first real coordinates of the first spot P1 from the first standard coordinates and the first spot coordinates (step S310). The first real coordinates are absolute coordinates with respect to the wafer coordinates system. That is, the origin of the first real coordinates is a basis point b1 of the wafer W. The first real coordinates are stored (step S312). The first real coordinates may be stored in the memory storage 240.

Next, the second spot P2 is determined whether it exists in the first view-field F1 (step S314). The determining step S314 may be performed by an operator.

If the second spot P2 does not exist in the first view-field F1, the operator, etc. inputs a predetermined command through the input device 250, and transfers the view-field F of the microscope 100 to a second view-field F2 including the second spot P2 (step S316). The second view-field F2 may have a high magnification. The first and second view-fields F1 and F2 may have the same magnification. While the view-field F of the microscope 100 is transferred from the first view-field F1 to the second view-field F2, a variable line 225 of the indicator 223 is extended in the view-window 221. Therefore, the view-window 221 displaying the second view-field F2 displays a portion of the indicator 223 (i.e. a portion of the variable line 225, a second fixed point 227 and a second bar 229). In the step S316 for transferring, the view-field F may have a low magnification.

The second fixed point 227 of the indicator 223 is fixed to the second spot P2 (S318). The coordinates control unit 212 calculates second standard coordinates of the second standard point S2 in the second view-field F2 (step 320). The second standard coordinates are absolute coordinates of the second standard point S2 with respect to the wafer coordinate system. Like the above method for calculating the first standard coordinates, the coordinates control unit 212 calculates the second standard coordinates by the position sensor 140 directly. Alternatively, the coordinates control unit 212 calculates the coordinates of a second corresponding point Q2 of the map 233 corresponding to the second standard point S2, and then calculates the second standard coordinates from the coordinates of the second corresponding point Q2. The step S320 for calculating the second standard coordinates may be performed upon receiving a signal from performing the step S318 for fixing the second fixed point 227. Conversely, the step S318 for fixing the second fixed point 227 may be performed after the step S320 for calculating the second standard coordinates.

The coordinates control unit 212 calculates second spot coordinates of the second spot P2 with respect to the second standard point S2 (step S322). The second spot coordinates are coordinates of a relative coordinate system having the second standard point S2 as an origin in the wafer coordinate system. The second spot coordinates may be calculated using the pixels in the view-window 221 displaying the picture of the second view-field F2 in the same way as for the first spot coordinates. The second spot coordinates may be stored in the memory storage 240. The step S322 for calculating the second spot coordinates may be performed upon receiving a signal from performing the step S318 for fixing the second fixed point 227.

The arithmetic unit 218 calculates the second real coordinates of the second spot P2 from the second standard coordinates and the second spot coordinates (step S324). The second real coordinates are absolute coordinates with respect to the wafer coordinate system. The second real coordinates is stored (step S326). The second real coordinates may be stored in the memory storage device 240.

The arithmetic unit 218 calculates a distance 'd' between the first and second spots P1 and P2 from the first and second real coordinates (step S328). The first and second real coordinates are absolute coordinates with respect to the wafer coordinate system, so that the distance 'd' may be calculated from the difference between the first and second real coordinates.

If the second spot P2 exists in the first view-field F1 as a result of the step S314, the steps S318 through S328 are carried out after the first real coordinates are stored (step S312). In this case, the first and second view-fields F1 and F2 are identical to each other and the first and second standard points S1 and S2 are the same, so that the step S320 for calculating the second standard coordinates may be left out. In this case, the distance 'd' of the first and second spots P1 and P2 are calculated using the coordinates thereof in the first view-field F1 of the high magnification. Therefore, the method according to the invention can measure the distance more precisely compared to the method using the conventional ruler.

In the above system and method of measuring a distance, the first and second spots P1 and P2 are selected inside the first and second view-fields F1 and F2 having high magnification, so that the error in measurement due to selection by an operator can be minimized. In addition, the spot coordinates are measured using the pixels of view-window 221 displaying the view-fields F1 and F2 having high magnification, so that the distance 'd' can be measured more precisely. In addition, even if the first view-field F1 and the second view-field F2 are separated from each other, the conventional stepping points need not be selected because the first/second standard coordinates are used. Thus, the errors in measurement caused by the conventional stepping points and the repeated times of measuring can be prevented. As a result, the distance between the two spots on the wafer W can be measured precisely and the error in measurement can be minimized.

As described above, a control unit calculates standard coordinates of the standard point and spot coordinates of a spot to be measured with respect to the standard point, and the control unit calculates real coordinates of the measured spot from the standard and spot coordinates. The control unit calculates distance between first and second spots from first and second real coordinates. Therefore, the error in measurement only relates to the selection of the first and second spots. That is, the error in measurement due to the conventional stepping points can be prevented. The error in measurement due to the selection of the first and second spots can be minimized by the view-field having a high magnification. As a result, the error of the distance measured in the wafer can be minimized.

Although the invention has been described in connection with the embodiment of the invention illustrated in the accompanying drawings, it is not limited thereto. It will be apparent to those skilled in the art that various substitution, modifications and changes may be thereto without departing from the scope and spirit of the invention.

What is claimed is:

1. A distance measuring system for measuring a distance between two spots on a wafer, comprising:
   a microscope to produce a picture of a predetermined view-field displaying a predetermined region of the wafer; and
   a control device, wherein the control device calculates:
   standard coordinates of respective standard points in respective view-fields that each include one of the two spots with respect to a basis point of the wafer;
   spot coordinates of the two spots, respectively, with respect to the respective standard points;
   real coordinates of the two spots, respectively, from the respective standard coordinates and the spot coordinates; and
   the distance between the two spots from the real spot coordinates.

2. The system of claim 1, wherein the standard points are center points of the view-fields, respectively.

3. The system of claim 1, wherein the spot coordinates are calculated using pixels of the picture of the respective view-fields picked up by the microscope.

4. A distance measuring system for measuring a distance between first and second spots on a wafer, comprising:
   a microscope to produce a picture of a predetermined view-field displaying a predetermined region of the wafer;
   a coordinates control unit to calculate first and second standard coordinates of first and second standard points in first and second view-fields including first and second spots with respect to a basis point of the wafer, respectively, and first and second spot coordinates of the first and second spots with respect to the first and second standard points, respectively; and
   an arithmetic unit to calculate first and second real coordinates of the first and second spots from the first and second standard coordinates and first and second spot coordinates, and the distance between the first and second spots from the first and second real coordinates, respectively.

5. The system of claim 4, wherein the microscope is an optical microscope, the optical microscope comprising;
   a stage where a wafer is loaded;
   a scan unit to capture a picture of the view-field;
   an image sensor to take the picture captured by the scan unit; and
   a position sensor connected to at least one of the stage and the scan unit to sense a position of the view-field with respect to the wafer,
   wherein at least one of the stage and the scan unit is capable of moving horizontally.

6. The system of claim 4, wherein the coordinates control unit comprises:
   a first coordinate control unit to calculate the first and second standard coordinates; and a second coordinate control unit to calculate the first and second spot coordinates using pixels of the picture of the first and second view-fields, respectively, taken by the microscope.

7. The system of claim 4, further comprising a memory storage to store at least the first and second real coordinates.

8. The system of claim 4, wherein the first and second standard points are center points of the first and second view-fields.

9. The system of claim 4, wherein the first and second view-fields are the same, and the first standard point and the second standard point are the same.

10. The system of claim 4, further comprising a display device including a view-window to show at least a picture of the view-field.

11. The system of claim 10, wherein the view-window further displays an indicator, the indicator comprising;
 a variable line capable of being extended according to a movement of the view-field;
 first and second fixed points that are end points of the variable line; and
 first and second bars each passing through the first and second fixed points perpendicularly to the variable line.

12. The system of claim 10, wherein the display device further displays a map showing at least a portion of a region of the wafer using a specific scale, and
 wherein the map includes first and second corresponding points that correspond to the first and second standard points.

13. The system of claim 12, wherein the coordinates control unit calculates coordinates of the first and second corresponding points with respect to a basis point of the map, and calculates the first and second standard coordinates from the coordinates of the first and second corresponding points.

14. The system of claim 10, further comprising a second display device to display a map showing at least a portion of a surface of the wafer using a specific scale,
 wherein the map includes first and second corresponding points that correspond to the first and second standard points.

15. The system of claim 14, wherein the coordinates control unit calculates coordinates of the first and second corresponding points with respect to a basis point of the map, and calculates the first and second standard coordinates from the coordinates of the first and second corresponding points.

16. A method of measuring a distance between first and second spots on a wafer using a distance measuring system including a microscope to produce a picture of a predetermined view-field displaying a predetermined region of the wafer, and a display device to display a view-window showing the picture of at least the view-field, the method comprising:
 calculating first standard coordinates of a first standard point in a first view-field including the first spot with respect to a basis point of the wafer;
 calculating first spot coordinates of the first spot with respect to the first standard coordinates;
 calculating first real coordinates of the first spot from the first standard coordinates and the first spot coordinates;
 calculating second standard coordinates of a second standard point in a second view-field including the second spot with respect to the basis point of the wafer;
 calculating second spot coordinates of the second spot with respect to the second standard coordinates;
 calculating second real coordinates of the second spot from the second standard coordinates and the second spot coordinates;
 calculating the distance between the first and second spots from the first and second real coordinates; and
 storing or displaying the distance.

17. The method of claim 16, wherein the first and second standard points are center points of the first and second view-fields, respectively.

18. The method of claim 16, after calculating the first standard coordinates and the first spot coordinates, further comprising changing the view-window from the first view-field to the second view-field.

19. The method of claim 16, wherein the first view-field and the second view-field are the same, and the first standard point and the second standard point are the same.

20. The method of claim 16, further comprising:
 storing the first standard coordinates and the first spot coordinates;
 storing the first real coordinates;
 storing the second standard coordinates and the second spot coordinates; and
 storing the second real coordinates.

21. The method of claim 16, before calculating the first spot coordinates, further comprising:
 displaying an indicator in the view-window, the indicator including a variable line capable of being extended according to the movement of the view-field, first and second fixed points that are end points of the variable line, and first and second bars each passing through the first and second fixed points perpendicularly to the variable line; and
 fixing the first fixed point to the first spot, and
 before calculating the second spot coordinates, extending the variable line to fix the second fixed point to the second spot.

22. The method of claim 16, before calculating the first standard coordinates, further comprising displaying a map illustrating an entire region of the wafer using a predetermined scale,
 wherein the calculating the first standard coordinates comprises:
 calculating coordinates of a first corresponding point in the map with respect to a basis point of the map, the first corresponding point corresponding to the first standard point in the wafer; and
 calculating first standard coordinates from the coordinates of the first corresponding point,
 wherein the calculating the second standard coordinates comprise:
 calculating coordinates of a second corresponding point in the map with respect to the basis point of the map, the second corresponding point corresponding to the second standard point in the wafer; and
 calculating second standard coordinates from the coordinates of the second corresponding point.

23. The method of claim 16, wherein the first and second spot coordinates are calculated using pixels of pictures of the first and second view-fields each produced by the microscope.

* * * * *